(12) United States Patent
Cheng et al.

(10) Patent No.: US 6,802,935 B2
(45) Date of Patent: Oct. 12, 2004

(54) SEMICONDUCTOR CHAMBER PROCESS APPARATUS AND METHOD

(75) Inventors: Yi-Lung Cheng, Taipei (TW); Hui-Chi Lin, Hsinchu (TW); Szu-An Wu, Hsin-Chu (TW); Ying-Lang Wang, Tai-Chung (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 2 days.

(21) Appl. No.: 10/103,618

(22) Filed: Mar. 21, 2002

(65) Prior Publication Data

US 2003/0178141 A1 Sep. 25, 2003

(51) Int. Cl.[7] .......................... B65G 49/07; C23F 1/00; C23C 16/00
(52) U.S. Cl. .......................... 156/345.32; 156/345.31; 118/719; 414/935
(58) Field of Search ..................... 118/719; 156/345.31, 156/345.32

(56) References Cited

U.S. PATENT DOCUMENTS

| | | | | |
|---|---|---|---|---|
| 5,286,296 A | * | 2/1994 | Sato et al. .................. | 118/719 |
| 5,611,861 A | * | 3/1997 | Higashi ...................... | 118/719 |
| 5,755,938 A | * | 5/1998 | Fukui et al. ............ | 204/298.23 |
| 5,934,856 A | * | 8/1999 | Asakawa et al. ........... | 414/217 |
| 5,944,940 A | * | 8/1999 | Toshima ................. | 156/345.29 |
| 5,951,770 A | * | 9/1999 | Perlov et al. ................ | 118/719 |
| 5,993,556 A | * | 11/1999 | Maidhof et al. ............. | 118/719 |
| 6,517,691 B1 | * | 2/2003 | Bluck et al. ........... | 204/298.25 |

* cited by examiner

Primary Examiner—Parviz Hassanzadeh
Assistant Examiner—Karla Moore
(74) Attorney, Agent, or Firm—Tung & Associates

(57) ABSTRACT

A semiconductor processing apparatus and method are disclosed herein, including a plurality of process chambers, wherein at least one semiconductor processing operation occurs within each process chamber among the plurality of process chambers. Additionally, the apparatus and method disclosed herein include a robot mechanism for rotating each process chamber among the plurality of process chambers upon completion of an associated semiconductor processing operation. Such a robot mechanism may comprise a plurality of robots. Specifically, such a plurality of robots may include six robots configured on an associated carousel.

15 Claims, 3 Drawing Sheets

SEMICONDUCTOR CHAMBER PROCESS APPARATUS AND METHOD

TECHNICAL FIELD

The present invention relates generally to semiconductor fabrication techniques and devices.

BACKGROUND OF THE INVENTION

In the semiconductor processing field, various process chambers can be utilized in association with a wafer handling system or device to perform a variety of semiconductor processes. These processes can include annealing, cleaning, chemical vapor deposition, oxidation, and nitridation. The processes may be applied under vacuum, under gas pressure and with the application of heat.

Semiconductor wafer processing systems comprised of multiple process chambers are well known in the art. Within these systems, wafers are generally prepared and processed through the deposition and treatment of multiple layers of conductive and semiconductive materials. Such tools process semiconductor wafers through a series of sequential steps to create integrated circuits. In such tools, a group of process chambers and preparatory chambers can be arranged in one or more clusters, each served by a robotic transfer mechanism. Hence, such tools are commonly referred to as cluster tools, which represent one type of wafer handling system or device currently in use. A commercially available example of a cluster tool is the Applied Materials Centura Platform (Applied Materials, 2881 Scott Boulevard, Santa Clara, Calif. 95050).

Chamber clusters within a cluster tool can be arranged by function with related functions located in separate clusters. For example, in some cluster tools utilized for metal deposition, there is a pre-metallization cluster where the wafers are admitted, oriented, degassed, sputter cleaned, subsequently cooled down and removed from the apparatus and at least one metallization cluster of process chambers wherein metal deposition, e.g., copper deposition, is performed. The various chambers of the pre-metallization cluster are serviced by a centrally located robotic transfer mechanism that is enclosed in a buffer chamber. Similarly, the process chambers of the process cluster are serviced by a centrally located robotic mechanism that is enclosed in a transfer chamber. Connecting these two clusters are transition chambers for moving the wafers between the metallization and pre-metallization clusters. These transition chambers are typically utilized for comparatively uncomplicated operations such as precleaning of the wafers prior to processing and cool down of the wafers after processing.

Regardless of whether semiconductor processing apparatus is configured as described above or in other arrangements known to those skilled in the art, it will be appreciated that the objective is simply to process the greatest number of wafers per unit of time in the most efficient manner. However, it is characteristic of all such apparatus that active chambers, i.e. those wherein semiconductor material is deposited or treated in some other manner, such as etching, must periodically be cleaned of the residues inherently formed during such procedures. It will further be appreciated that it is desirable to have as high a throughput as possible without sacrifice of the quality of the operation carried out in a deposition chamber before it must be cleaned.

Mechanical wafer handling systems transport wafers from wafer carriers to processing chambers and vice versa. Various fabrication processes are carried out in processing chambers, including annealing, oxidation, nitridation, etching, and deposition. The wafer handling system might include a robot, an arm operated by the robot, and an implement at the end of the arm to hold the wafer. To date, however, such wafer handling systems have been designed to include a single robot and the utilization of only four chambers. Additionally, such devices generally permit only two recipes to be combined into four processes. Every two processes are run in-situ at the same process chamber. Because of this design, different processes run in the same process chamber.

Thus, it is difficult to clean the chamber and particle performance becomes worse due to the lack of cleaning control thereof. Because of this particle issue, resulting semiconductor circuit device yields can be severely damaged. Thus, a need exists for an apparatus and method that can overcome the cleaning problems and particle issues associated with prior art wafer handling systems and devices, such as, for example, the Centura line of devices described earlier. The present inventors have designed a unique apparatus and method which can overcome these aforementioned problems.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore an aspect of the present invention to provide an improved semiconductor processing apparatus and method.

It is another aspect of the present invention to provide an improved apparatus and method for cleaning one or more process chambers of a semiconductor processing apparatus.

It is yet another aspect of the present invention to provide an improved semiconductor processing apparatus and method wherein semiconductor processing operations are separated in different process chambers.

It is still another aspect of the present invention to provide an improved robot mechanism that operations in association with a semiconductor processing apparatus.

It is also an aspect of the present invention to prevent particle accumulation in process chambers utilized in semiconductor processing devices.

The above and other aspects of the present invention can thus be achieved as is now described. A semiconductor processing apparatus and method are disclosed herein, including a plurality of process chambers, wherein at least one semiconductor processing operation occurs within each process chamber among the plurality of process chambers. Additionally, the apparatus and method disclosed herein include a robot mechanism for rotating each process chamber among the plurality of process chambers upon completion of an associated semiconductor processing operation.

Such a robot mechanism may comprise a plurality of robots. Specifically, such a plurality of robots may include six robots configured on an associated carousel. Additionally a plurality of semiconductor processing operations can occur within the process chambers. The robot mechanism rotates each process chamber in a manner and a sequence for permitting the efficient cleaning of each process chamber and prevention of particle accumulation thereof.

A cleaning mechanism for cleaning a process chamber among the plurality of process chambers immediately following completion of a semiconductor processing operation within the process chamber may also be included. The plurality of process chambers can be comprise a first process chamber, a second process chamber, a third process chamber; a fourth process chamber; a sixth process chamber, and a seventh process chamber. The sixth process chamber may be configured as a multistage cooling chamber, while the seventh process chamber may be configured as a load lock chamber.

The robot mechanism may comprise a first robot associated with the first process chamber, a second robot associated with the second process chamber, a third robot associated with the third process chamber, a fourth robot associated with the fourth process chamber, a fifth robot associated with the multistage cooling chamber, and a sixth robot associated with the load lock chamber, wherein the first, second, third, fourth and fifth robots rotate on a carousel associated with the semiconductor processing apparatus.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
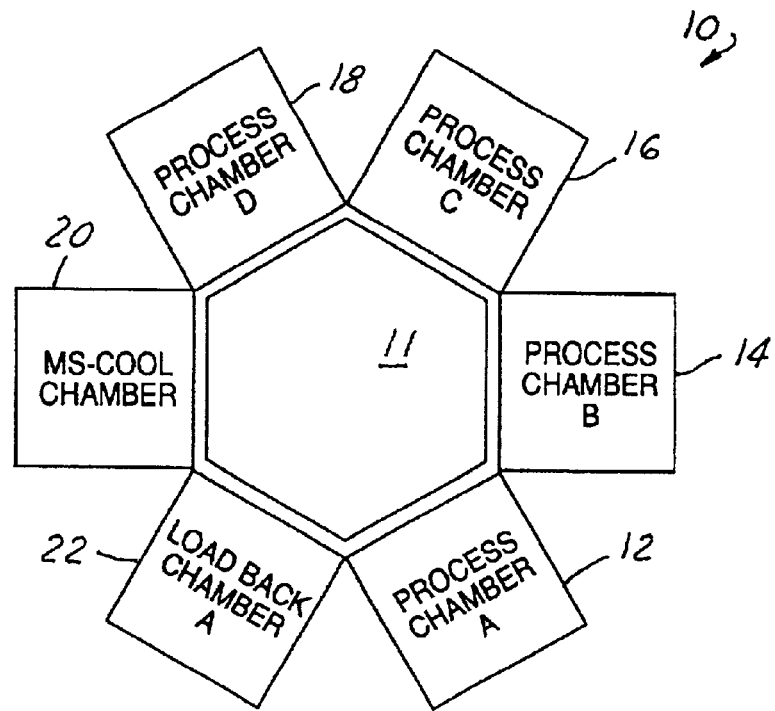
FIG. 1 illustrates a block diagram illustrating a semiconductor processing apparatus, in accordance with a preferred embodiment of the present invention.

FIG. 1 illustrates a block diagram illustrating a semiconductor processing apparatus 10, in accordance with a preferred embodiment of the present invention. Note that in FIGS. 1 to 4 illustrated herein. Semiconductor apparatus 10 generally illustrates a wafer handling system or device that can be implemented in accordance with the apparatus and method of the present invention. Semiconductor processing apparatus includes a first process chamber 12, which is labeled "Process Chamber A" and a second process chamber 14, which is labeled "Process Chamber B." Additionally, a third process chamber 16 is illustrated in FIG. 1 and is labeled "Process Chamber C." A fourth process chamber 18 is also illustrated in FIG. 1 and is labeled "Process Chamber D."

A fifth process chamber 20 is labeled "MS-Cool Chamber" and a sixth process chamber 22 is labeled "Load Back Chamber A." A central portion 11 of semiconductor processing apparatus 10 is surrounded by process chambers 12, 14, 16, 18, 20, and 22. Based on the foregoing, it can be appreciated that particular semiconductor processing operations (i.e., "processes") are separated into different process chambers. Thus, for example, one particular semiconductor processing operation may occur with process chamber A, while another type of semiconductor processing operation may occur within process chamber B, and so forth.

Figure 2:
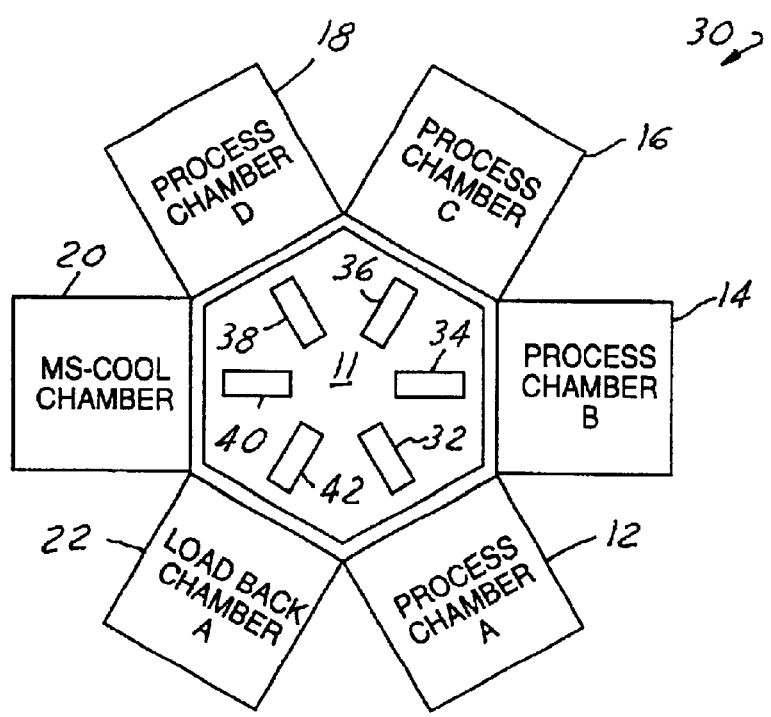
FIG. 2 depicts a block diagram depicting a semiconductor processing apparatus and a plurality of robots, in accordance with a preferred embodiment of the present invention.

FIG. 2 depicts a block diagram depicting a semiconductor processing apparatus 30 and a plurality of robots, in accordance with a preferred embodiment of the present invention. Semiconductor apparatus 30 generally illustrates a wafer handling system or device that can be implemented in accordance with the apparatus and method of the present invention. Robots 32, 34, 36, 38, 40, and 42 comprise such a plurality of robots. Robot 32 is generally associated with process chamber 12, while robot 34 is generally associated with process chamber 14. Robot 36 is generally associated with process chamber 16, and robot 38 is generally associated with process chamber 18. Robot 40 is associated with process chamber 20, and robot 42 is associated with process chamber 22. Robots 32 to 42 thus are located generally within central portion 11. Recall that in FIGS. 1 and 2, like parts are indicated by like reference numerals.

Figure 3:
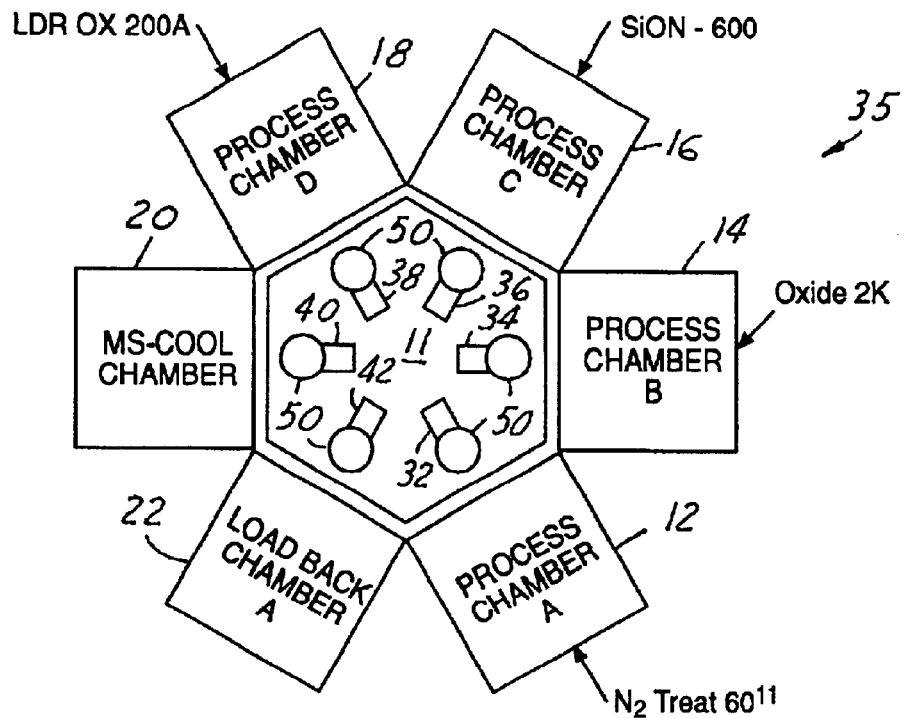
FIG. 3 illustrates a block diagram illustrating a semiconductor processing apparatus and chemical processing steps thereof, in accordance with a preferred embodiment of the present invention.

FIG. 3 illustrates a block diagram illustrating a semiconductor processing apparatus 35 and chemical processing steps thereof, in accordance with a preferred embodiment of the present invention. Semiconductor apparatus 35 generally illustrates a wafer handling system or device that can be implemented in accordance with the apparatus and method of the present invention. Thus, process chamber 18 can be utilized to implement an LDR OX 200A process or operation. Process chamber 16 can be utilized to implement an SiON-600 process or operation. Process chamber 15 can be utilized to implement an oxide 2K process or operation. Finally, process chamber 10 can be utilized to implement an $N_2$ treat $60^{11}$ operation. Those skilled in the art can appreciate that such processes or operations depicted in FIG. 3 are illustrative examples only and are not considered limiting features of the present invention. Additionally, FIG. 3 illustrates a semiconductor wafer 50 at varying positions within central portion 11.

Figure 4:
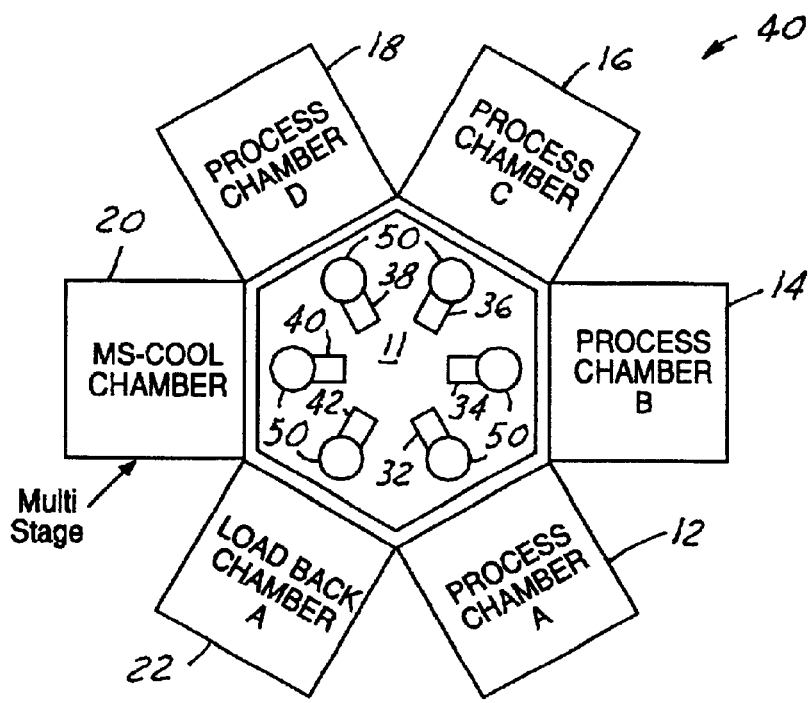
FIG. 4 depicts a block diagram illustrating a semiconductor processing apparatus, in accordance with a preferred embodiment of the present invention.

FIG. 4 depicts a block diagram illustrating a semiconductor processing apparatus 40, in accordance with a preferred embodiment of the present invention. Semiconductor apparatus 40 generally illustrates a wafer handling system or device that can be implemented in accordance with the apparatus and method of the present invention. Semiconductor processing apparatus 40 includes process chamber 20, which comprises a multistage process chamber and process chamber 22, which comprises a load back chamber. Central portion 11 generally comprises a carousel upon which robots 32 to 42 may be configured. Such robots rotate on the carousel. Note that semiconductor processing apparatus 40 is analogous to apparatus 10, 30, and 35 illustrated in FIGS. 1 to 3 herein. Additionally, as indicated earlier, in FIGS. 1 to 4, like parts are indicated by identical reference numerals.

Figure 5:
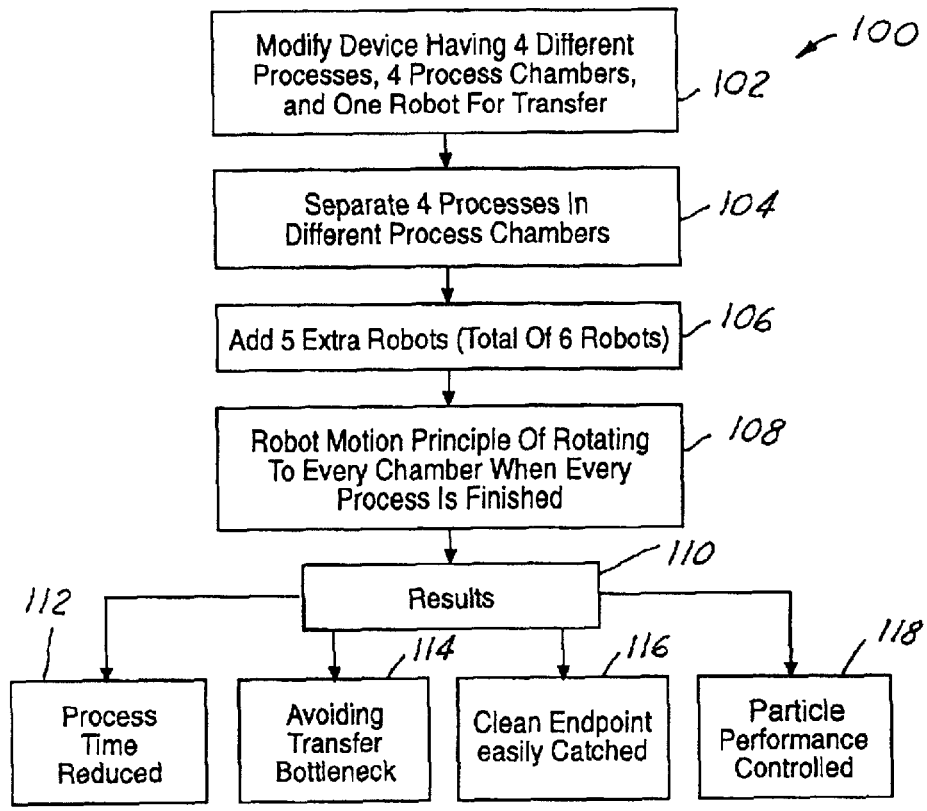
FIG. 5 illustrates a high level flow chart of operations illustrating general operational steps for configuring a semiconductor processing apparatus in accordance with a preferred embodiment of the present invention.

FIG. 5 illustrates a high level flow chart 100 of operations illustrating general operational steps for configuring a semiconductor processing apparatus in accordance with a preferred embodiment of the present invention. As illustrated at block 102, a semiconductor processing device or apparatus having four different processes, four process chambers, and one robot for transferring wafers from one process chamber to another can be modified in accordance with the apparatus and method of the present invention. Thus, as depicted at block 104, such a device may be configured so that the four processes are separated into different process chambers. Additionally, five extra robots can be added for a total of six robots, as indicated at block 106.

A robot motion principle can then be applied to the configured device, such that rotation automatically occurs to every chamber when every processed is finished, as indicated at block 108. Thereafter, as illustrated at block 108, particular results and benefits can be achieved, including as depicted at block 112, a reduction in process time due to an associated pump/venting time reduction (i.e., original: 2 time, improvement: 1 time). As indicated at block 114, a transfer bottleneck can also be achieved as a result of the modifications explained herein. Additionally, as illustrated at block 116, the clean endpoint can be easily caught due to single film deposition. Finally, as depicted at block 118, a delicate chamber can be utilized for a single process to control particle performance thereof.

Figure 6:
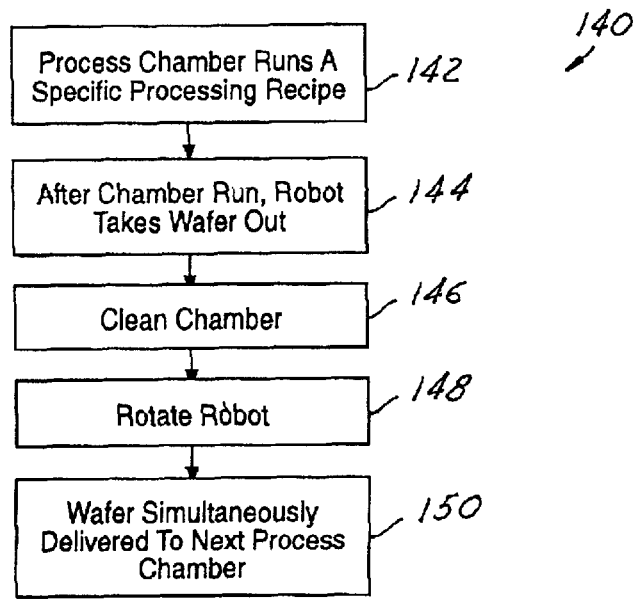
FIG. 6 depicts a high level flow chart of operations illustrating general operation steps for cleaning process chambers, in accordance with a preferred embodiment of the present invention.

FIG. 6 depicts a high level flow chart 140 of operations illustrating general operation steps for cleaning process chambers, in accordance with a preferred embodiment of the present invention. As indicated at block 142, a process chamber can run a specific processing recipe. Examples of such a process chamber include process chambers 12 to 22 illustrated in FIGS. 1 to 4 herein. After a particular chamber run, a robot, such as one of the robots 32 to 42 illustrated in FIG. 2 can be utilized to take the wafer out of the process chamber. For example, robot 32 can be utilized to remove a wafer from process chamber 12 when a particular operation or process taking place within process chamber 12 is complete.

Robot 32 then rotates to process chamber 14 (or alternatively, process chamber 22) to place the semiconductor wafer into process chamber 14 for particular semiconductor processing associated with process chamber 14. Thus as depicted at block 144, after the chamber run, the robot removes the wafer from the process chamber. Thereafter, as illustrating at block 146, the chamber may be cleaned utilizing, for example, a cleaning mechanism. Next, as indicated at block 148, the robot is rotated on an associated carousel (e.g., central portion 11) and simultaneously delivered, as illustrated at block 150, to the next process chamber.

Based on the foregoing, it can be appreciated that the present invention disclosed herein generally describes a semiconductor processing apparatus and method that includes a plurality of process chambers, wherein at least one semiconductor processing operation occurs within each process chamber among the plurality of process chambers. Additionally, the apparatus and method disclosed herein includes a robot mechanism for rotating each process chamber among the plurality of process chambers upon completion of an associated semiconductor processing operation.

Such a robot mechanism may comprise a plurality of robots. Specifically, such a plurality of robots may include six robots configured on an associated carousel. Additionally a plurality of semiconductor processing operations can occur within the process chambers. The robot mechanism rotates each process chamber in a manner and a sequence for permitting the efficient cleaning of each process chamber and prevention of particle accumulation thereof.

A cleaning mechanism for cleaning a process chamber among the plurality of process chambers immediately following completion of a semiconductor processing operation within the process chamber may also be included. The plurality of process chambers can be comprise a first process chamber, a second process chamber, a third process chamber; a fourth process chamber; a sixth process chamber, and a seventh process chamber. The sixth process chamber may be configured as a multistage cooling chamber, while the seventh process chamber may be configured as a load lock chamber.

The robot mechanism may comprise a first robot associated with the first process chamber, a second robot associated with the second process chamber, a third robot associated with the third process chamber, a fourth robot associated with the fourth process chamber, a fifth robot associated with the multistage cooling chamber, and a sixth robot associated with the load lock chamber, wherein the first, second, third, fourth and fifth robots rotate on a carousel associated with the semiconductor processing apparatus.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A semiconductor processing apparatus, comprising:
   a plurality of process chambers, wherein at least one semiconductor processing operation occurs within each process chamber among said plurality of process chambers;
   a robot mechanism for rotating a process chamber among said plurality of process chambers upon completion of a semiconductor processing operation associated with said process chamber, wherein said robot mechanism rotates each process chamber among said plurality of process chambers in a manner and a sequence for permitting the efficient cleaning of each process chamber and prevention of particle accumulation thereof;
   a plurality of robots, wherein each robot of said plurality robots can perform a processing task at a process chamber among said plurality of process chambers;
   a carousel which rotates at least one robot among said plurality of robots to at least one process chamber among said plurality of process chambers upon completion of an associated semiconductor processing operation.

2. The semiconductor processing apparatus of claim 1 wherein at least one process chamber among said plurality of process chambers comprises at least one of the following types of process chambers: a multistage cooling chamber and a load lock chamber.

3. The semiconductor processing apparatus of claim 1 wherein said plurality of robots comprises six robots.

4. The semiconductor processing apparatus of claim 1 wherein said robot mechanism comprises said plurality of robots, such that said plurality of robots are configured upon said carousel.

5. The semiconductor processing apparatus of claim 3 wherein said six robots are located upon said carousel.

6. The semiconductor processing apparatus of claim 1 wherein said:

a carousel is associated with said plurality of process chambers.

7. The semiconductor processing apparatus of claim 1 wherein a plurality of semiconductor processing operations occur within said plurality of process chambers, including an oxide operation, an SiON operation and an $N_2$ treatment operation.

8. The semiconductor processing apparatus of claim 1 further comprising:

cleaning mechanism for cleaning a process chamber among said plurality of process chambers immediately following completion of a semiconductor processing operation within said process chamber.

9. The semiconductor processing apparatus of claim 1 whereIn said plurality of process chambers comprises:

a first process chamber;

a second process chamber;

a third process chamber;

a fourth process chamber;

at least one multistage cooling chamber; and at least one load lock chamber.

10. The semiconductor processing apparatus of claim 9 wherein robot mechanism comprises:

a first robot associated with said first process chamber;

a second robot associated with said second process chamber;

a third robot associated with said third process chamber;

a fourth robot associated with said fourth process chamber;

a fifth robot associated with said at least one multistage cooling chamber; and a sixth robot associated with said at least one load lock chamber, wherein said first, second, third, fourth and fifth robots rotate on a carousel associated with said semiconductor processing apparatus.

11. A semiconductor processing apparatus, comprising:

a plurality of process chambers, wherein at least one semiconductor processing operation occurs within each process chamber among said plurality of process chambers;

a robot mechanism for rotating a process chamber among said plurality of process chambers upon completion of a semiconductor processing operation associated with said process chamber;

a plurality of robots, wherein each robot of said plurality robots can perform a processing task at a process chamber among said plurality of process chambers;

a carousel associated which rotates at least one robot among said plurality of robots to at least one process chamber among said plurality of process chambers upon completion of an associated semiconductor processing operation;

a cleaning mechanism for cleaning a process chamber among said plurality of process chambers immediately following completion of a semiconductor processing operation within said process chamber; and wherein said robot mechanism rotates each process chamber in a manner and a sequence for permitting the efficient cleaning of each process chamber and prevention of particle accumulation thereof.

12. The semiconductor processing apparatus of claim 11 wherein said plurality of process chambers comprises:

a first process chamber;

a second process chamber;

a third process chamber;

a fourth process chamber;

at least one multistage cooling chamber; and at least one load lock chamber.

13. The semiconductor processing apparatus of claim 11 wherein robot mechanism comprises:

a first robot associated with said first process chamber;

a second robot associated with said second process chamber;

a third robot associated with said third process chamber;

a fourth robot associated with said fourth process chamber;

a fifth robot associated with said at least one multistage cooling chamber; and a sixth robot associated with said at least one load lock chamber, wherein said first, second, third, fourth and fifth robots rotate on a carousel associated with said semiconductor processing apparatus.

14. A semiconductor processing apparatus, comprising:

a plurality of process chambers, wherein at least one semiconductor processing operation occurs within each process chamber among said plurality of process chambers;

a robot mechanism for rotating a process chamber among said plurality of process chambers upon completion of a semiconductor processing operation associated with said process chamber, wherein said robot mechanism further comprises a plurality of robots, wherein each robot of said plurality robots can perform a processing task at a process chamber among said plurality of process chambers;

a carousel associated which rotates at least one robot among said plurality of robots to at least one process chamber among said plurality of process chambers upon completion of an associated semiconductor processing operation;

a cleaning mechanism for cleaning a process chamber among said plurality of process chambers immediately following completion of a semiconductor processing operation within said process chamber; and wherein said robot mechanism rotates each process chamber in a manner and a sequence for permitting the efficient cleaning of each process chamber and prevention of particle accumulation thereof.

15. The semiconductor processing apparatus of claim 14 wherein said plurality of robots comprises six robots for increased throughput thereof.

* * * * *